(12) United States Patent
Gektin et al.

(10) Patent No.: US 9,851,520 B2
(45) Date of Patent: Dec. 26, 2017

(54) OPTICAL COMMUNICATION COMPONENT COOLING

(71) Applicant: Futurewei Technologies, Inc., Plano, TX (US)

(72) Inventors: Vadim Gektin, San Jose, CA (US); Xing Fu, Shenzhen (CN); Chengpeng Yang, Shenzhen (CN)

( * ) Notice: Subject to any disclaimer, the term of this patent is extended or adjusted under 35 U.S.C. 154(b) by 0 days.

(21) Appl. No.: 15/135,846

(22) Filed: Apr. 22, 2016

(65) Prior Publication Data
US 2017/0307837 A1    Oct. 26, 2017

(51) Int. Cl.
*G02B 6/12* (2006.01)
*G02B 6/42* (2006.01)
*H01S 5/024* (2006.01)

(52) U.S. Cl.
CPC .......... *G02B 6/4271* (2013.01); *G02B 6/428* (2013.01); *G02B 6/4272* (2013.01); *G02B 6/4295* (2013.01); *H01S 5/02415* (2013.01)

(58) Field of Classification Search
CPC .... G02B 6/4271; G02B 6/4272; G02B 6/428; G02B 6/4295; H01S 5/02415
USPC ................................................ 385/14, 88–92
See application file for complete search history.

(56) References Cited

U.S. PATENT DOCUMENTS

| | | | | |
|---|---|---|---|---|
| 9,054,809 B2* | 6/2015 | Han | ................... | H04B 10/2575 |
| 9,063,310 B2* | 6/2015 | Ishii | ..................... | G02B 6/4246 |
| 9,468,085 B2* | 10/2016 | Louderback | ......... | H05K 1/0203 |
| 9,496,959 B1* | 11/2016 | Nagarajan | .............. | H04B 10/40 |
| 9,506,675 B1* | 11/2016 | Campbell | ................ | F25B 21/02 |
| 9,509,092 B2* | 11/2016 | Shen | ................. | H01R 13/62994 |
| 2004/0151505 A1* | 8/2004 | Aronson | ............. | H01S 5/02212 |
| | | | | 398/138 |
| 2007/0194433 A1* | 8/2007 | Suwa | ................. | H01L 23/49838 |
| | | | | 257/700 |
| 2010/0215314 A1* | 8/2010 | Lau | .......................... | G02B 6/43 |
| | | | | 385/14 |
| 2016/0269117 A1* | 9/2016 | Chang | ..................... | G02B 6/00 |

FOREIGN PATENT DOCUMENTS

JP            11257789 A    *    9/1999

* cited by examiner

*Primary Examiner* — Ellen Kim

(57) ABSTRACT

An optical communication package includes a circuit layer, an optical component electrically coupled to the circuit layer to optically communicate outside of the package, and a thermoelectric cooler electrically coupled to the circuit layer and disposed to transfer heat from the optical component to the circuit layer.

20 Claims, 3 Drawing Sheets

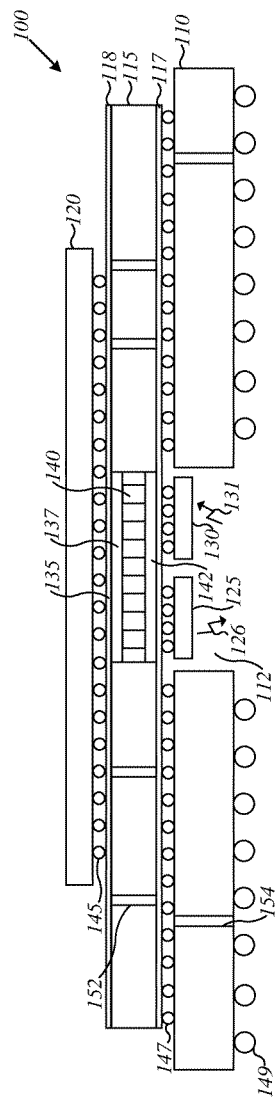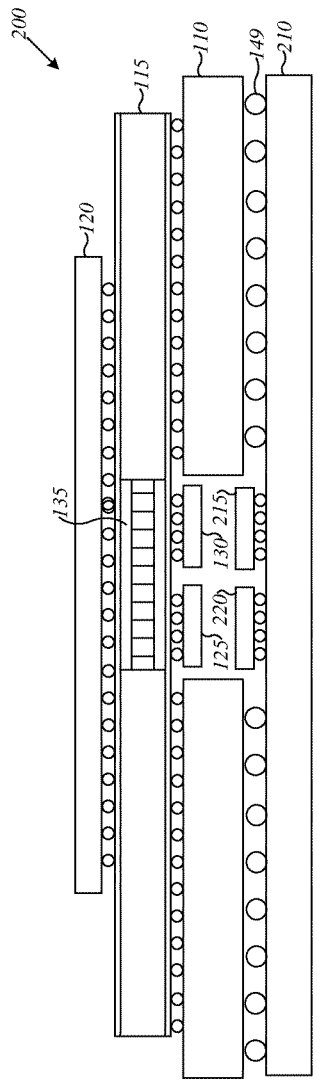

OPTICAL COMMUNICATION COMPONENT COOLING

FIELD OF THE INVENTION

The present disclosure is related to optical communications cooling and in particular to a configuration for cooling an optical communication structure.

BACKGROUND

Circuitry for communicating using optical components, such as a vertical cavity surface emitting laser and a photodetector, are generally located in a same package as electronic circuitry and may in fact be directly mounted on or thermally proximate a chip containing the electronic circuitry. The electronic circuitry may generate significant amounts of heat. The optical components may be more sensitive to heat than the electronic circuitry, imposing strict thermal requirements on the package containing both optical components and circuitry.

SUMMARY

An optical communication package includes a circuit layer, an optical component electrically coupled to the circuit layer to optically communicate outside of the package, and a thermoelectric cooler electrically coupled to the circuit layer and disposed to transfer heat from the optical component to the circuit layer.

An optical communication package includes a substrate having an opening, a redistribution layer supported by and electrically coupled to the substrate, a circuit layer supported by and electrically coupled to the redistribution layer, optical components electrically coupled to the redistribution layer and positioned to optically communicate through the opening in the substrate, and a thermoelectric cooler disposed between the circuit layer and the optical components to transfer heat from the optical components to the circuit layer.

A system includes an optical communications chip having a circuit layer, an interposer layer having one or more redistribution layers, a first optical component electrically coupled to the circuit layer via the one or more redistribution layers, a thermoelectric cooler disposed to transfer heat away from the first optical component, and a printed circuit board supporting a second optical component optically coupled to the first optical component.

BRIEF DESCRIPTION OF THE DRAWINGS

FIG. 1 is an elevated cross section block diagram of an optical communications package according to an example embodiment.

FIG. 2 is an elevated cross section block diagram of two coupled optical communication packages according to an example embodiment.

DETAILED DESCRIPTION

Figure 3:
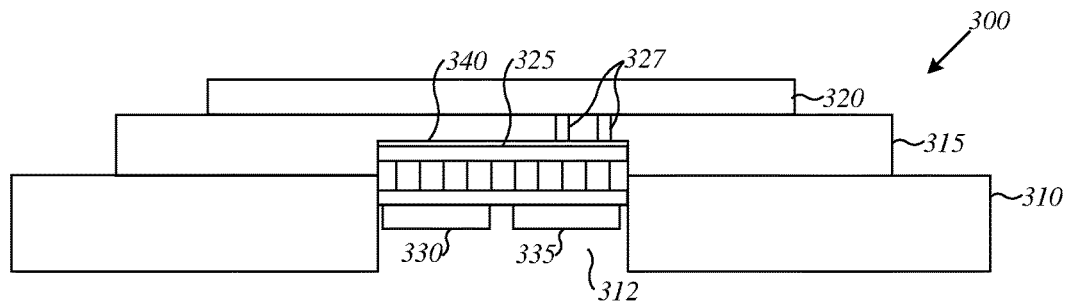
FIG. 3 is a simplified elevated cross section block diagram of an alternative optical communications package according to an example embodiment.

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

In various embodiments, a thermoelectric cooling mechanism is used to transfer heat away from optical communications components in an optical communications package. The thermoelectric cooling mechanism may be disposed between the optical components and a circuit layer that generates more heat than the optical components. The heat generated by the circuit layer may also result in an increase in the temperature of the optical components. The thermoelectric cooling mechanism may operate to transfer heat from the optical components to the circuit layer, allowing the optical components to operate within desired temperature ranges that are lower than those specified for the circuitry, while the package temperature is allowed to be higher.

FIG. 1 is an elevated cross section block diagram of an optical communications package indicated generally at 100. A substrate 110 is formed with a window, referred to as an opening 112. The substrate may be formed of alumina oxide or glass ceramic, or other suitable material such as an organic material in different embodiments. An interposer layer 115 is formed between two redistribution layers 117 and 118 that operate to redistribute electrical signals between circuitry in one or more levels of the package 100. A circuitry layer 120 is supported by the interposer layer 115. In one embodiment, the circuitry layer 120 may be a complementary metal oxide semiconductor (CMOS) layer that has circuitry that generates heat when operating, such as an application specific integrated circuit (ASIC), processor of a central processing unit (CPU), graphics processor, or other densely packed circuitry that generates significant amounts of heat when operating. The interposer layer 115 and redistribution layers 117 and 118 provide structure integrity and connectivity between the substrate 110 and circuitry layer 120.

A first optical component 125 is supported by the interposer layer 115 opposite the circuitry layer 120 and is positioned within the opening 112 of the substrate 110 to transmit optical signals 126 away from the package 100. First optical component 125 may be an array of vertical cavity surface emitting lasers (VCSEL) in one embodiment. Also positioned within the opening 112 of the substrate 110 is a second optical component 130, which receives optical signals 131. The optical component 130 may be an array of photo diodes that is supported by the interposer layer 115. The optical components may be electrically coupled to the substrate and circuitry via the redistribution layers to receive signals and power.

A thermoelectric cooler 135 may be embedded in the interposer layer 115 between the circuitry layer 120 and the optical components 125 and 130 in one embodiment. In one embodiment, the thermoelectric cooler 135 is positioned directly between the optical components 125, 130 and the circuitry layer 120 to minimize a length of signal transferring connections between the circuitry and optical components to reduce potential signal strength loss. The thermoelectric cooler 135 may include a first thermal plate 137, alternately doped semiconductor columns 140, and a second thermal plate 142. The thermal plates may be formed of ceramic or other thermally conductive materials in further embodiments.

The alternately doped semiconductor columns 140 are electrically coupled in series to utilize the Peltier effect in one embodiment when a direct current voltage is applied across them. As DC electricity flows through the cooler 135, heat is transferred from one side to the other via the Peltier effect, so that one side gets cooler while the other gets hotter. The "hot" side is thermally coupled to the circuitry layer 120 in one embodiment via thermal conducting plate 137, and the cool side is thermally coupled to the optical components 125, 130 via thermally conducting plate 142 to keep the optical components cooler than the circuitry. In some embodiments, multiple coolers can be cascaded together for lower temperature.

In one embodiment, the alternate oppositely doped semiconductor columns comprise one n-type and one p-type to provide different electron densities. The semiconductor columns may be placed thermally in parallel to each other and electrically in series and then joined with a thermally conducting plate on each side. When a voltage is applied to the free ends of the two semiconductors there is a flow of DC current across the junction of the semiconductors causing a temperature difference. The side with the cooling plate absorbs heat which is then moved to the other side of the device where circuitry is. Other types of thermoelectric coolers may be used in further embodiments.

Various structures are used to provide interconnections and power to the circuity 120, optical components 125 and 130, and thermoelectric cooler 135. Solder bumps are shown at 145, 147, and 149. The electrical connections, as well as structural connections of the various layers which may be formed separately utilizing well known semiconductor processing techniques may be provided the solder bumps. The solder bumps or other types of connectors may be used to couple the separately formed layers together, such as the substrate 110, interposer layer 115 and circuitry layer 120. When solder bumps are used, they may be heated to reflow the solder bumps and create electrical contacts and operate to adhere the various layers together.

The redistribution layers 117 and 118 in various embodiments may be single or multiple layers of conductors formed to provide conductive paths that may utilize the solder bumps or other types of connectors to transfer signals between the layers and within a layer. The interposer layer 115 may be formed of silicon, glass, or other electrically insulating material and may have conductive columns or vias indicated at 152 formed therein to transfer signals between the redistribution layers 117 and 118. Wire bonding, among other techniques may also be used to form electrical connections between the redistribution layers.

Vias or conductive columns indicated at 154 may also be formed in the substrate to provide electrical power and other signals to and from the package 100 via redistribution layer 117. Solder bumps 147 or other connectors may also be used to mount or bond the package 100 with other components, which may have corresponding optical components to provide for optical communications.

In one embodiment, the interposer layer 115 with redistribution layers 117, 118, thermoelectric cooler 135, and vias 152 may be formed by first forming the interposer layer 115 and then one of the redistribution layers 117 or 118 on the interposer layer 115. An opening in the interposer layer 115 may then be formed using etching, followed by deposition of a thermal plate 142, the semiconductor columns 140, and another thermal plate 137. This may be followed by formation of the vias 152 and then the other redistribution layer 118. In further embodiments, the layers may be formed on a carrier substrate starting with one redistribution layer 117, the interposer layer 115, the thermoelectric cooler 135, vias 152, and then the other redistribution layer 118. The carrier substrate may then be removed, followed by addition of the circuitry layer 120, optical components 125, 130 and substrate 110 to form the package 100.

FIG. 2 is an elevated cross section block diagram of an optical communication package coupled to optically communicate with another device indicated generally at 200. The optical communication package is a duplicate of package 100, and is mounted on a device 210, such as a printed circuit board (PCB) to provide power and other signals to the package. Device 210 may include optical components 215 and 220 facing optical components 125 and 130 of package 100 to provide optical communications between the package 100 and device 210. In other words, the laser 125 in the package 100 is aligned with the photo detector 220 in the device 210 and the photo detector 130 in the package 100 is aligned with the laser 215 in the device 210.

In one embodiment, circuit layer 120 may be an optical communications chip, and device 210 may be a printed circuit board of a line card. Device 210 may be physically coupled to the substrate 110 in a manner such that respective optical components are aligned and optically coupled for optical transfer of information during operation. The line card provides optical outputs, and may be part of a system, also represented by device 210, such as a high end core router that includes one or more line cards. In one embodiment, the router comprises a switch.

The solder bumps 149 may be used to couple the package 100 and device 210 together in one embodiment when reflowed. In further embodiments, other types of connectors, fasteners, or adhesive may be used to couple the packages together.

FIG. 3 is a simplified elevated cross section block diagram of an alternative optical communications package 300. Package 300 includes a substrate 310 with an opening 312. An interposer layer 315 with redistribution layers is supported by the substrate 310 with a circuitry layer 320 above the interposer layer 315. The solder bumps and redistribution layers, as well as vias or other connectors are not shown for convenience of illustration.

In package 300, a thermoelectric cooler 325 is moved lower than in FIG. 1, extending into the opening 312 of the substrate, and optionally only partially embedded in the interposer layer 315. Electrical connections to the thermoelectric cooler 325 may be made using vias or conductive columns in the interposer layer 315 as indicated at 327 and a redistribution layer 340 formed between the interposer layer 315 and thermoelectric cooler 325 to provide electrical connections to the thermoelectric cooler 325. Optical elements 330 and 335 in this embodiment are located closer to a bottom of the substrate, which may provide better optical connections to other devices. Electrical connections to the optical elements 330 and 335 may be made through the thermoelectric cooler 325 or utilizing other connection methods such as wire bonding or a further redistribution layer formed between the optical elements and the thermoelectric cooler.

Figure 4:
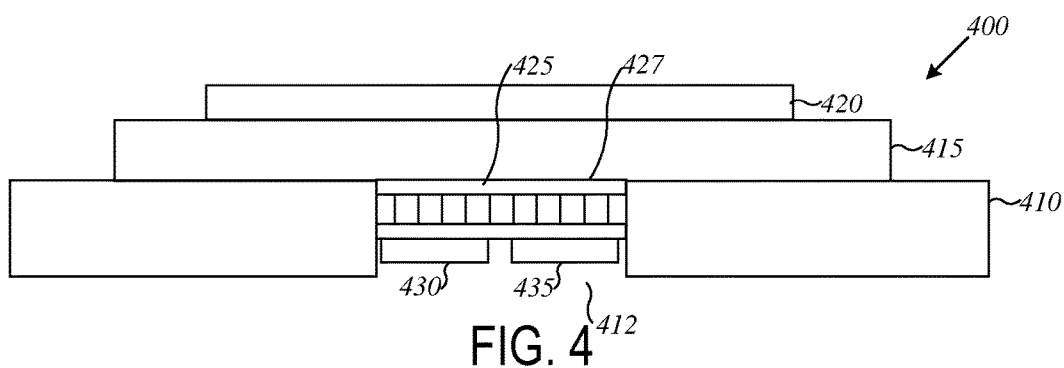
FIG. 4 is a simplified elevated cross section block diagram of an alternative optical communications package according to an example embodiment.

FIG. 4 is a simplified elevated cross section block diagram of an alternative optical communications package 400. Package 400 includes a substrate 410 with an opening 412. An interposer layer 415 with redistribution layers is supported by the substrate 410 with a circuitry layer 420 above the interposer layer 415. The solder bumps and redistribution layers, as well as vias or other connectors are not shown for convenience of illustration.

In package 400, a thermoelectric cooler 425 is moved lower than in FIG. 1 and FIG. 3, extending into or embedded in the opening 412 of the substrate and is supported adjacent the interposer layer 415. Electrical connections to the thermoelectric cooler 425 may be made using the redistribution layer in the interposer layer 415 as indicated at 427. Optical elements 430 and 435 in this embodiment are located still closer to a bottom of the substrate, which may provide better optical connections to other devices. Electrical connections to the optical elements 430 and 435 may be made through the thermoelectric cooler 425 or utilizing other connection methods such as wire bonding or a further redistribution layer formed between the optical elements and the thermoelectric cooler.

Figure 5:
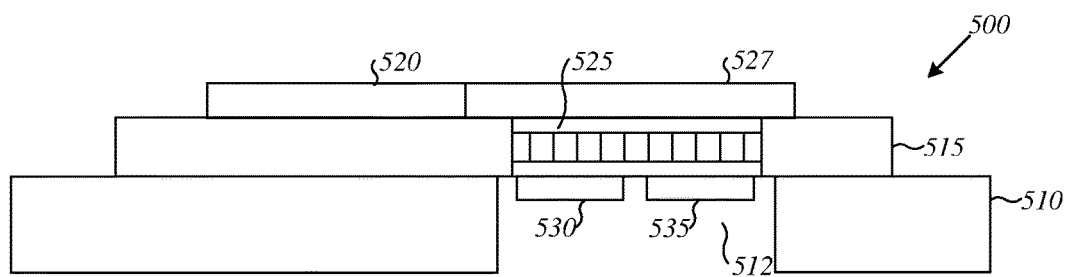
FIG. 5 is a simplified elevated cross section block diagram of an alternative optical communications package according to an example embodiment.

FIG. 5 is a simplified elevated cross section block diagram of an alternative optical communications package 500. Package 500 includes a substrate 510 with an opening 512. An interposer layer 515 with redistribution layers is supported by the substrate 510 with a circuitry layer 520 above the interposer layer 515. The solder bumps and redistribution layers, as well as vias or other connectors are not shown for convenience of illustration.

In package 500, a thermoelectric cooler 525 is embedded in interposer layer 515 as in FIG. 1. However, the circuitry layer 520 may not extend fully over the thermoelectric cooler 525. In one embodiment, a thermally conductive layer or plate 527 is formed thermally coupled to and adjacent the thermoelectric cooler, and may also be thermally coupled to the circuitry layer 525. Heat from optical elements 530 and 535 supported by the thermoelectric cooler, is transferred to the plate 527, which may be made of copper in one embodiment.

Figure 6:
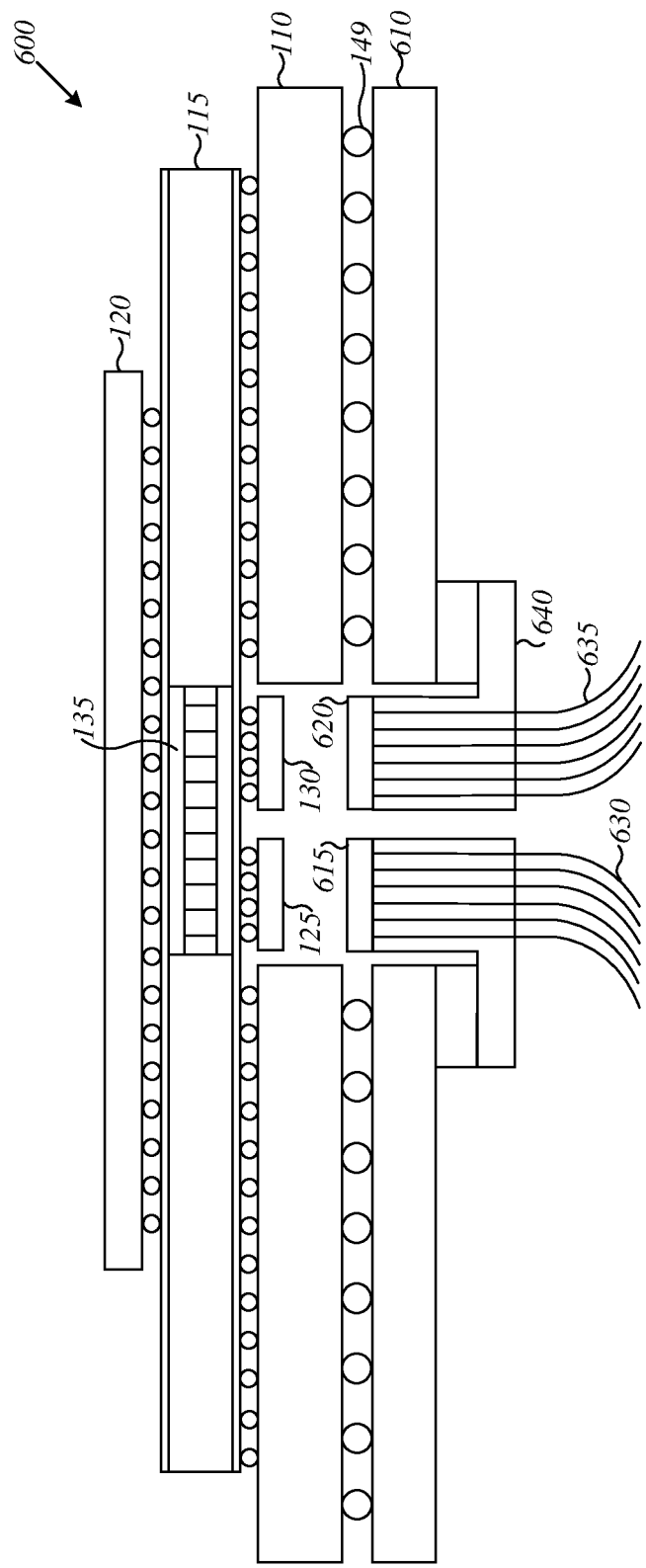
FIG. 6 is an elevated cross section block diagram of two coupled optical communication packages with an optical fiber bundle assembly according to an example embodiment.

FIG. 6 is an elevated cross section block diagram of an optical communication package coupled to optically communicate with another device indicated generally at 600. The optical communication package is a duplicate of package 100, and is mounted on a device 610, such as a printed circuit board (PCB) to provide power and other signals to the package. Device 610 may include optical components, such as optical fiber bundle assemblies 615 and 620 facing optical components 125 and 130 of package 100 to provide optical communications between the package 100 and device 610. In other words, the array of lasers 125 in the package 100 is aligned with the bundle assembly 615 in the device 610 and the array of photo detectors 130 in the package 100 is aligned with the bundle assembly 620 in the device 610.

In one embodiment, arrays of optical fibers 630 and 635 are optically coupled to carry optical signals to and from the array of lasers 125 and array of photodetectors 130. The bundle assemblies 615 and 620 align the bundles of optical fibers 630 and 635 with the corresponding optical elements. The bundle assemblies 615 and 620 are supported by the device 610 as indicated at fiber optics cable bundle 640 via an optional spacer, and may be formed of a material that is suitable for providing stable retention and positioning of optical fibers with respect to the photo detectors 130 and lasers 125.

The solder bumps 149 may be used to couple the package 100 and device 610 together in one embodiment when reflowed. In further embodiments, other types of connectors, fasteners, or adhesive may be used to couple the packages together.

In one embodiment, circuit layer 120 may be an optical communications chip, and device 610 may be a printed circuit board of a line card. The line card may provide optical outputs, and may be part of a system, also represented by device 610, such as a high end core router that includes one or more line cards. In one embodiment, the router comprises a switch.

EXAMPLES

1. In example 1, a method comprises an optical communication package that includes a circuit layer and an optical component electrically coupled to the circuit layer to optically communicate outside of the package. A thermoelectric cooler is electrically coupled to the circuit layer and disposed to transfer heat from the optical component to the circuit layer.

2. The optical communication package of example 1 wherein the circuit layer is coupled to the optical component and the thermoelectric cooler by a redistribution layer positioned between the circuit layer and the optical component.

3. The optical communication package of example 2 wherein the redistribution layers comprises two layers sandwiching an interposer layer.

4. The optical communication package of example 3 wherein the thermoelectric cooler is embedded in the interposer layer and positioned directly between the optical component and the circuit layer.

5. The optical communication package of example 4 and further comprising multiple electrical contacts positioned to connect the two layers of the redistribution layer.

6. The optical communication package of any of examples 1-5 wherein the optical component comprises a vertical cavity surface emitting laser (VCSEL) and a photo detector (PD).

7. The optical communication package of any of examples 1-6 wherein the circuit layer comprises a complementary metal oxide semiconductor (CMOS) layer that includes a processor.

8. The optical communication package of any of examples 1-7 wherein the thermoelectric cooler comprises two thermal plates coupled to a plurality of thermoelectric elements.

9. In example 9, an optical communication package includes a substrate having an opening. A redistribution layer is supported by and electrically coupled to the substrate. A circuit layer is supported by and electrically coupled to the redistribution layer. Optical components are electrically coupled to the redistribution layer and positioned to optically communicate through the opening in the substrate. A thermoelectric cooler is disposed between the circuit layer and the optical components to transfer heat from the optical components to the circuit layer.

10. The optical communication package of example 9 wherein the redistribution layers comprises two layers sandwiching an interposer layer.

11. The optical communication package of example 10 wherein the thermoelectric cooler is embedded in the interposer layer and positioned directly between the optical components and the circuit layer.

12. The optical communication package of example 11 and further comprising multiple contacts positioned to connect the two layers of the redistribution layer.

13. The optical communication package of any of examples 9-12 wherein the optical components comprises a vertical cavity surface emitting laser (VCSEL) and a photo detector (PD).

14. The optical communication package of any of examples 9-13 wherein the circuit layer comprises a complementary metal oxide semiconductor (CMOS) layer that includes a processor.

15. The optical communication package of any of examples 9-14 wherein the thermoelectric cooler comprises two thermal plates coupled to a plurality of thermoelectric elements.

16. In example 16, an optical communication package includes a circuit layer and an interposer layer having one or more redistribution layers. An optical component is electrically coupled to the circuit layer via the one or more redistribution layers. A thermoelectric cooler is disposed to transfer heat away from the optical component.

17. The optical communication package of example 16 wherein the thermoelectric cooler is embedded in the interposer layer between the circuity layer and the optical component.

18. The optical communication package of any of examples 16-17 and further comprising a substrate supporting the interposer layer and having an opening to facilitate optical communications outside of the package by the optical component, wherein the thermoelectric cooler is partially embedded in the interposer layer and the opening of the substrate.

19. The optical communication package of any of examples 16-18 and further comprising a substrate supporting the interposer layer and having an opening to facilitate optical communications outside of the package by the optical component, wherein the thermoelectric cooler is embedded in the opening of the substrate.

20. The optical communication package of any of examples 16-19 and further comprising a thermally conductive plate thermally coupled to the circuit layer and wherein the thermoelectric cooler is embedded in the interposer layer between the thermally conductive plate and the optical component.

21. In example 21, a system includes an optical communications chip having a circuit layer, an interposer layer having one or more redistribution layers, a first optical component electrically coupled to the circuit layer via the one or more redistribution layers, a thermoelectric cooler disposed to transfer heat away from the first optical component, and a printed circuit board supporting a second optical component optically coupled to the first optical component.

22. The system of example 21 wherein the printed circuit board comprises a router.

23. The system of any of examples 21-22 wherein the first optical component comprises an array of lasers and an array of photo diodes, and the second optical component comprises a pair of optical fiber bundles, each optical fiber bundle being optically coupled to respective arrays of lasers and photo diodes.

24. The system of example 23 wherein the printed circuit board comprises an opening through which the optical fiber bundles extend to facilitate optical communications outside of the system.

25. The system of example 21 and further comprising a thermally conductive plate thermally coupled to the circuit layer and wherein the thermoelectric cooler is embedded in the interposer layer between the thermally conductive plate and the first optical component.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

What is claimed is:

1. An optical communication package comprising:
a circuit layer;
a optical component disposed parallel to and below the circuit layer and electrically coupled to the circuit layer to optically communicate outside of the package; and
a thermoelectric cooler that:
is embedded in an interposer layer between the circuitry layer and the optical components, and is thermally coupled to and disposed directly between the circuit layer and the optical component; and
comprises doped semiconductor columns that conduct heat that are axially disposed in an orthogonal manner to the optical component and circuit layer.

2. The optical communication package of claim 1 wherein the circuit layer is coupled to the optical component and the thermoelectric cooler by a redistribution layer positioned between the circuit layer and the optical component.

3. The optical communication package of claim 2 wherein the redistribution layers comprises two layers sandwiching the interposer layer.

4. The optical communication package of claim 3 wherein the thermoelectric cooler is embedded in the interposer layer and positioned directly between the optical component and the circuit layer.

5. The optical communication package of claim 4 and further comprising multiple electrical contacts positioned to connect the two layers of the redistribution layer.

6. The optical communication package of claim 1 wherein the optical component comprises a vertical cavity surface emitting laser (VCSEL) and a photo detector (PD).

7. The optical communication package of claim 1 wherein the circuit layer comprises a complementary metal oxide semiconductor (CMOS) layer that includes a processor.

8. The optical communication package of claim 1 wherein the thermoelectric cooler comprises two thermal plates coupled to a plurality of thermoelectric elements.

9. An optical communication package comprising:
a substrate having an opening;
at least two redistribution layers supported by and electrically coupled to the substrate;
a circuit layer supported by and electrically coupled to the redistribution layer;
an optical components disposed parallel to the circuit layer and electrically coupled to the redistribution layer and the circuit layer via the at least two redistribution layers and positioned to optically communicate through the opening in the substrate; and
a thermoelectric cooler that:
is thermally coupled to and is disposed directly between the at least two redistribution layers between the circuit layer and the optical component; and comprises doped semiconductor columns that conduct heat that are axially disposed in an orthogonal manner to the optical component and circuit layer.

10. The optical communication package of claim 9 wherein the redistribution layers comprises two layers sandwiching the interposer layer.

11. The optical communication package of claim 10 wherein the thermoelectric cooler is embedded in the interposer layer and positioned directly between the optical components and the circuit layer.

12. The optical communication package of claim 11 and further comprising multiple contacts positioned to connect the two layers of the redistribution layer.

13. The optical communication package of claim 9 wherein the optical components comprises a vertical cavity surface emitting laser (VCSEL) and a photo detector (PD).

14. The optical communication package of claim 9 wherein the circuit layer comprises a complementary metal oxide semiconductor (CMOS) layer that includes a processor.

15. The optical communication package of claim 9 wherein the thermoelectric cooler comprises two thermal plates coupled to a plurality of thermoelectric elements.

16. A system comprising:
   an optical communications chip having a circuit layer;
   an interposer layer having at least two redistribution layers;
   an optical component disposed parallel to the circuit layer and electrically coupled to the circuit layer via the at least two redistribution layers;
   a thermoelectric cooler that:
      is thermally coupled to and disposed directly between the two redistribution layers disposed between the circuit layer and the optical component; and
      comprises doped semiconductor columns that conduct heat that are axially disposed in an orthogonal manner to the optical component and circuit layer; and
   a printed circuit board (PCB) supporting a second optical component optically coupled to the optical component.

17. The system of claim 16 wherein the printed circuit board comprises a router.

18. The system of claim 16 wherein the first optical component comprises an array of lasers and an array of photo diodes, and the second optical component comprises a pair of optical fiber bundles, each optical fiber bundle being optically coupled to respective arrays of lasers and photo diodes.

19. The system of claim 18 wherein the printed circuit board comprises an opening through which the optical fiber bundles extend to facilitate optical communications outside of the system.

20. The system of claim 16 and further comprising a thermally conductive plate thermally coupled to the circuit layer and wherein the thermoelectric cooler is embedded in the interposer layer between the thermally conductive plate and the first optical component.

* * * * *